US009273978B2

(12) United States Patent
Walker et al.

(10) Patent No.: US 9,273,978 B2
(45) Date of Patent: Mar. 1, 2016

(54) METHODS, DEVICE AND SYSTEMS FOR DELIVERY OF NAVIGATIONAL NOTIFICATIONS

(75) Inventors: David Ryan Walker, Waterloo (CA); Jerome Pasquero, Waterloo (CA)

(73) Assignee: BLACKBERRY LIMITED, Waterloo (CA)

( * ) Notice: Subject to any disclaimer, the term of this patent is extended or adjusted under 35 U.S.C. 154(b) by 506 days.

(21) Appl. No.: 12/684,175

(22) Filed: Jan. 8, 2010

(65) Prior Publication Data

US 2011/0169632 A1 Jul. 14, 2011

(51) Int. Cl.
G08B 1/08 (2006.01)
G01C 21/36 (2006.01)
H03G 3/32 (2006.01)

(52) U.S. Cl.
CPC .............. *G01C 21/3629* (2013.01); *H03G 3/32* (2013.01)

(58) Field of Classification Search
CPC ....... H03G 3/32; G01C 21/3629; G10L 13/00
USPC ..................................... 340/539.13
See application file for complete search history.

(56) References Cited

U.S. PATENT DOCUMENTS

| 4,342,023 | A | 7/1982 | Tsunoda et al. |
| 5,493,692 | A | 2/1996 | Theimer et al. |
| 6,360,187 | B1* | 3/2002 | Hermann ........... G01C 21/3629 340/460 |
| 6,381,534 | B2 | 4/2002 | Takayama et al. |
| 6,519,335 | B1 | 2/2003 | Bushnell |
| 6,917,680 | B1 | 7/2005 | Korn et al. |
| 6,954,657 | B2 | 10/2005 | Bork et al. |
| 7,046,784 | B2 | 5/2006 | Seligmann |
| 7,089,041 | B2 | 8/2006 | Huang |
| 7,142,664 | B2 | 11/2006 | Seligmann |
| 7,466,828 | B2* | 12/2008 | Ito ........................ H04B 1/082 381/119 |
| 8,140,255 | B2* | 3/2012 | Furumoto .......... G01C 21/3629 381/71.4 |
| 8,275,307 | B2* | 9/2012 | Doyle, III ............ H04H 20/106 340/426.11 |
| 2002/0087649 | A1* | 7/2002 | Horvitz ................ G06Q 10/107 709/207 |
| 2002/0116156 | A1* | 8/2002 | Remboski .............. G09B 9/052 702/188 |
| 2002/0126038 | A1 | 9/2002 | Kroculick |
| 2003/0065441 | A1* | 4/2003 | Funk .................. G01C 21/3608 701/468 |
| 2006/0069500 | A1 | 3/2006 | Hashizume |
| 2006/0223547 | A1 | 10/2006 | Chin et al. |
| 2007/0063875 | A1* | 3/2007 | Hoffberg ............. G08G 1/0104 340/995.1 |
| 2008/0132290 | A1 | 6/2008 | Sharabi et al. |
| 2008/0195305 | A1 | 8/2008 | Jendbro et al. |

(Continued)

FOREIGN PATENT DOCUMENTS

EP 1067682 A2 1/2001
GB 2358553 7/2001

(Continued)

*Primary Examiner* — Naomi Small
(74) *Attorney, Agent, or Firm* — Perry + Currier Inc.

(57) ABSTRACT

The disclosure is directed to a method, computer program product, mobile device for delivering a navigational notification generated for a mobile device. The delivering of the navigational notification includes obtaining one or more notification parameters and one or more audio parameters; and controlling the delivery of the navigational notification at least partly based on the notification parameters and the audio parameters. The notification parameters are indicative of one or more aspects of the navigational notification such as time-sensitivity, priority or the like. Various configurations of computer program products, mobile devices and systems for controlling the delivery of the navigational notification are also described.

25 Claims, 7 Drawing Sheets

(56) References Cited

U.S. PATENT DOCUMENTS

| | | |
|---|---|---|
| 2009/0141173 A1 | 6/2009 | Pugel |
| 2009/0157294 A1* | 6/2009 | Geelen .............. G01C 21/3655 701/532 |
| 2009/0177601 A1 | 7/2009 | Huang et al. |
| 2009/0216433 A1 | 8/2009 | Griesmer et al. |
| 2009/0295562 A1* | 12/2009 | Shuster ................ H04M 19/04 340/506 |
| 2009/0322560 A1* | 12/2009 | Tengler ............... G08G 1/0104 340/905 |
| 2010/0332003 A1* | 12/2010 | Yaguez .................. G10L 15/22 700/94 |
| 2011/0169632 A1* | 7/2011 | Walker .................... H03G 3/32 340/539.13 |

FOREIGN PATENT DOCUMENTS

| | | | | |
|---|---|---|---|---|
| JP | WO 2009090702 A1 | * | 7/2009 | ......... G01C 21/3629 |
| WO | WO 2009090702 A1 | * | 7/2009 | |

* cited by examiner

METHODS, DEVICE AND SYSTEMS FOR DELIVERY OF NAVIGATIONAL NOTIFICATIONS

CROSS-REFERENCE TO RELATED APPLICATIONS

This is the first application filed for the present technology.

TECHNICAL FIELD

The present disclosure relates generally to mobile devices and, in particular, to techniques for delivering navigational notifications generated for a mobile device.

BACKGROUND

Mobile devices such as hand-held GPS units and in-vehicle GPS units been developed for providing navigation guidance. Other mobile devices such as GPS-enabled wireless communications devices have also been equipped with navigation functionality for providing navigation guidance. These devices are configured to determine the location of the mobile device and to allow a user to specify a destination. Automated algorithms and map databases are used to determine a route from the current location to the desired destination. Navigational notifications generated for the route may include turn-by-turn route guidance instructions. Navigational notifications now also include passive reassurance notifications such as "keep straight" in addition to those requiring some action on the part of the user. In addition, traffic and weather updates and other location-based information may also be included.

Navigational notifications are typically presented either visually on a display, audibly via a speaker, or both. Users may find updates and passive reassurance notifications annoying or intrusive in some situations, for example, if they are listening to music or enjoying a conversation. In addition, a user may easily miss audio notifications while listening to music or enjoying a conversation. The user may thus fail to take an appropriate action based on the notification.

BRIEF DESCRIPTION OF THE DRAWINGS

Features and advantages of the present technology will become apparent from the following detailed description, taken in combination with the appended drawings, in which.

It will be noted that throughout the appended drawings, like features are identified by like reference numerals.

DETAILED DESCRIPTION

The present technology generally provides a method, system and computer program product capable of obtaining one or more notification parameters and one or more audio parameters indicative of ambient sound, and controlling delivery of navigational notifications based at least partly on the notification and audio parameters.

Accordingly, an aspect of the present technology is to provide a method of delivering a navigational notification generated for a mobile device configured to allow a determination of its location, said method comprising: obtaining one or more notification parameters; obtaining one or more audio parameters indicative of an ambient sound; and controlling delivery of said navigational notification, said controlling at least partly based on said notification parameters and said audio parameters.

Another aspect of the present technology is to provide a computer program product for delivering a navigational notification generated for a mobile device, said mobile device configured to allow a determination of its location, said computer program product comprising code which, when loaded into a memory and executed on an operatively associated processor, is adapted to perform the following: obtaining one or more notification parameters; obtaining one or more audio parameters indicative of an ambient sound; and controlling delivery of said notification, said controlling at least partly based on said notification and audio parameters.

Yet another aspect of the present technology is to provide a mobile device configured to allow a determination of its location for generation of a navigational notification, said mobile device comprising: a delivery control module configured to obtain one or more audio parameters and one or more notification parameters, said delivery control module further configured to generate one or more control signals for delivery of the navigational notification, said one or more control signals based at least in part on the audio parameters and the notification parameters.

The disclosure is directed to a method, computer program product, and mobile device for controlling delivery of navigational notifications based on aspects of the notification and the ambient sound. Various configurations of computer program products, mobile devices and systems for achieving the above are described. Exemplary aspects of a navigational notification include time-sensitivity and priority of a notification.

Figure 1:
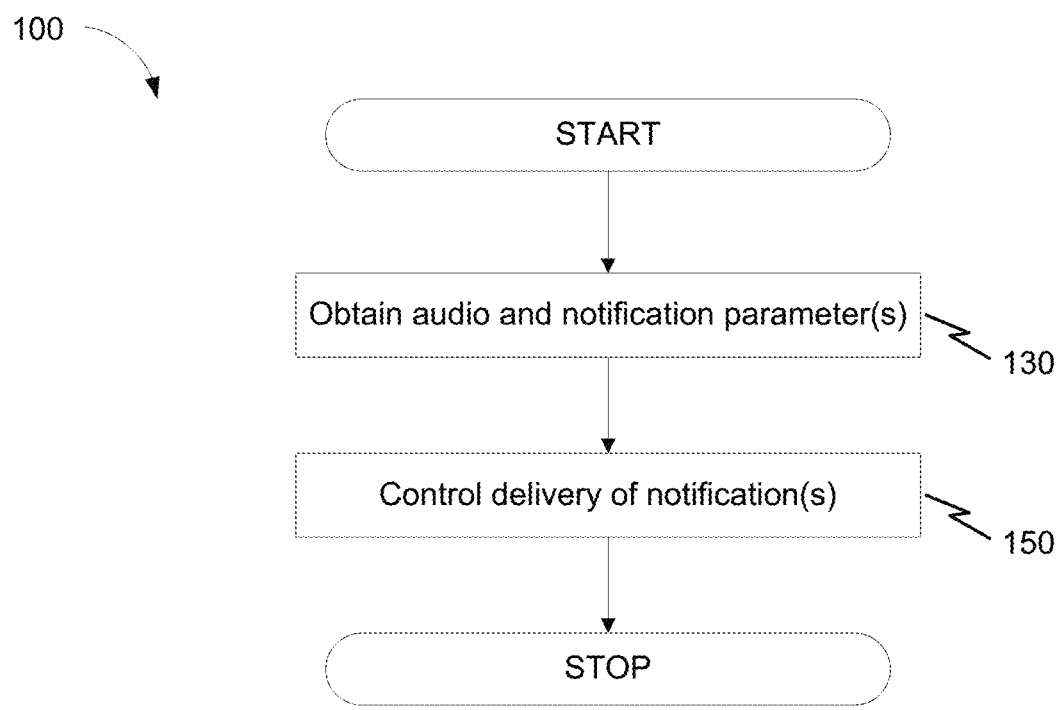
FIG. 1 is an exemplary flowchart presenting steps of a method for controlling delivery of navigational notifications in accordance with embodiments of the present technology.

FIG. 1 illustrates acts performed in association with embodiments of the present technology. FIG. 1 illustrates a method 100 for delivering navigational notifications generated for a mobile device, the method generally comprising obtaining 130 one or more notification parameters and one or more audio parameters and controlling delivery of the navigational notification 150 based at least in part on the obtained parameters.

Exemplarily, a notification such as "turn right in 2 km" is generated based on a determination of the location of a mobile device. The notification is delivered at an appropriate time and in an appropriate mode based at least partly on the obtained notification and audio parameters.

Notification Parameters

One or more notification parameters may be associated with a navigational notification. Notification parameters may be indicative of different aspects of the notification including but not limited to time-sensitivity, priority and length of the notification or a preferred delivery mode for the notification.

As mentioned above, the delivery of a notification is based, at least in part, on the notification parameters. Accordingly, in embodiments of the present technology the delivery of a notification is controlled based, at least in part, on aspects of the notification such as time-sensitivity, and priority. Exemplarily, a notification may be delivered immediately if the notification is time-sensitive, has high priority or both.

(a) Time-sensitivity Parameter

In embodiments, a navigational notification may have an associated time-sensitivity parameter indicative of the time sensitivity of the notification.

The time-sensitivity of a notification may be indicative of whether or not the notification has to be delivered within or before a certain time. For example, a notification may be time-sensitive because it becomes obsolete after a certain time (for example, "destination in 15 minutes") or because the notification is related to an action that has to be taken or will occur at a certain time or location (for example, "left turn in 2 km").

The time-sensitivity of a notification may be based on the nature of the notification. For example, a notification used to reassure the driver such as "keep on going straight, you are on the right track" may have a low time-sensitivity while a notification such as "you have missed the exit" may have a high time-sensitivity.

The time-sensitivity of a notification may also be based on the context of the notification. In embodiments, the time-sensitivity of a notification may be based partly on distance or time lapsed since delivery of the last notification or the like. For example, the time sensitivity of a notification may be high if a long period of time has passed since the last notification was delivered to the user. In embodiments, the time sensitivity may also be based partly on an estimate of distance or time remaining before the next notification will be generated.

A worker skilled in the art will understand that the above-noted factors are merely exemplary and not intended to form an exhaustive list of factors that affect the time-sensitivity of a notification.

In embodiments, the time-sensitivity parameter may be indicative of the notification being "time-sensitive" or "not time-sensitive". In embodiments, the time-sensitivity parameter may be indicative of a level of time-sensitivity where the levels may be discrete or substantially continuous. In embodiments, there may be multiple discrete levels of time-sensitivity for notifications. For example, the time-sensitivity levels may be "low", "moderate" and "high". In other embodiments, the time-sensitivity parameter may be indicative of a substantially continuous degree of time-sensitivity. For example, the time sensitivity parameter for a particular notification may be indicative of the time in minutes available for notification to be delivered.

(b) Priority Parameter

In embodiments, a notification may have an associated priority parameter indicative of the priority of the notification. The priority of a notification may be related to its importance. If the notification is of an importance such that it is must be delivered, for example, "heavy traffic in 50 kms" or "turn here now", it may be considered to have a high priority. In contrast, a notification such as "destination in 15 minutes" or "keep on going straight" may be considered to have a moderate or low priority. In embodiments, a priority parameter may be indicative of a priority level of a notification. There may be two or more levels of priority for notifications.

A notification may have high priority and high time-sensitivity, such as "turn here now". A notification may have low priority and low time-sensitivity, such as "keep on going straight". A notification may also have high priority and low time-sensitivity such as "heavy traffic in 50 kms" or it may have low priority and high time-sensitivity such as "destination in 15 minutes".

Figure 2:
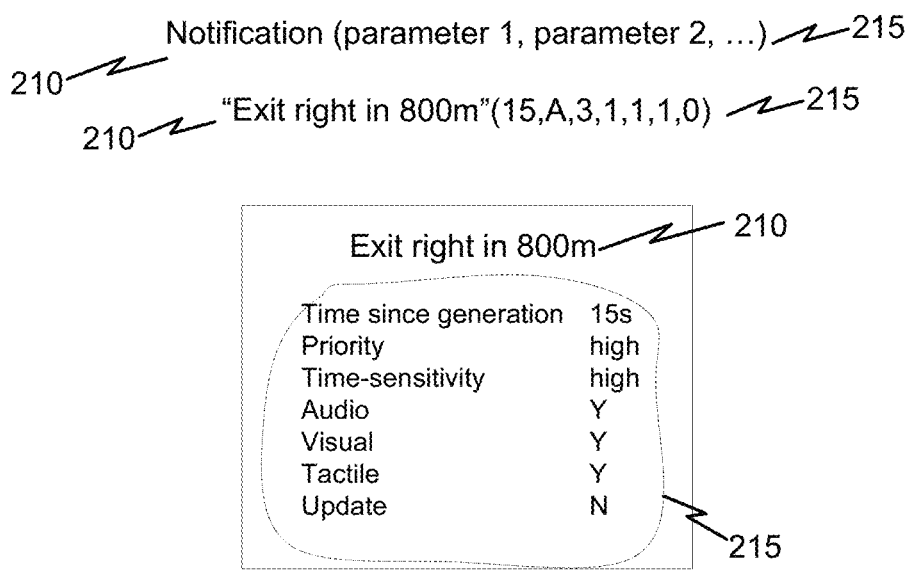
FIG. 2 illustrates various notification parameters associated with an exemplary navigational notification.

Notification parameters may be represented in the form of Boolean variables, alphabetical or numerical indicators, numerical values or combinations thereof. They may be attached to or associated with the notification in the form of a tag or flag. The tag or flag may be accessible independently of the notification and may be used for control purposes, exemplarily to determine the number of messages or the total length of messages awaiting delivery. FIG. 2 is an illustration of a notification 210 with associated notification parameters 215 in accordance with an embodiment of the present technology.

In embodiments, the notification parameters are determined based on an analysis of the notification. In embodiments, the notification parameters may be based, at least in part, on an input from a user. In embodiments, the user may specify notification parameters for different types of notifications. For example, the user may specify that all notifications related to traffic be assigned a high priority and time-sensitivity. The user-specification may be via a selection of a configuration. For example, when the user is on an unfamiliar route, the user may select an "unfamiliar route" configuration which assigns a higher level of priority to reassurance notifications such as "keep going straight".

Notification parameters may be static or may be dynamically updated. For example, consider a notification such as "heavy traffic on Interstate 95". The priority parameter of this notification may be static and indicative of a high priority level from the time of generation until delivery. However, the time-sensitivity parameter may be dynamically updated as the time-sensitivity of this notification increases with time as the user approaches Interstate 95. The time-sensitivity parameter associated with this notification may be indicative of a low time-sensitivity when it is generated. However, if the notification is not delivered for a certain period of time, the time-sensitivity parameter may be updated at a later time to indicate a higher level of time-sensitivity.

Associated with each notification parameter, there may be a notification threshold criterion. As detailed in a later section, assessment of the notification parameters with respect to the associated notification threshold criteria may determine at least partly the delivery of the notification. In scenarios, the delivery of the notification is at least partly based on whether the notification parameter satisfies the associated notification threshold criterion.

Audio Parameters

As mentioned previously, the delivery of a navigational notification may be controlled, at least in part, based on one or more audio parameters indicative of the ambient sound. For example, the delivery of a notification may be based on factors such as whether or not the ambient sound level is high, whether the user is listening to music on the car stereo and the like.

Typically, the ambient sound comprises several components. For example, in a vehicular environment the ambient sound may include components such as engine noise, noise from mechanical motion of other vehicular parts, wind, rain or traffic sounds, audio content from the car stereo, conversations and the like. Some components of ambient sound may be substantially constant (for example, engine noise) while others may be variable (for example, music) or intermittent (for example, conversation or traffic sounds). Some components of ambient sound may be controllable (such as the sounds from a car stereo) and some may be predictable (for example, car radio tuned to a music station and playing known song tracks.) Audio parameters may be indicative of the overall ambient sound or of a particular component of ambient sound.

In embodiments, the ambient sound may be sensed by one or more sensors. Components of ambient sound may be sensed independently or by processing the sensed overall ambient sound. Some components of the ambient sound may be obtained directly from the corresponding audio source by means other than a sensor. Some components of ambient sound may be predicted in advance instead of being obtained in real time.

In embodiments, ambient sound may be sensed by a sensing module comprising a sensor such as a microphone configured to convert the sensed acoustic signal into electrical signals for further processing. The ambient sound may be processed to identify, isolate, separate or remove one or more components. Different components of the ambient sound may be identified or processed using techniques that will be readily known to a worker skilled in the art. For example, specific components of the sound may be identified by their spectral characteristics. The frequency of car engine sounds may be correlated with the RPM of the engine which can be measured. As another example, consistent sounds such as car engine sounds may be filtered out by using a previously detected "baseline" signal. As yet another example, speech recognition algorithms may be used to recognize speech patterns in the ambient sound and thus to detect pauses in conversation.

Some components of the ambient sound may be obtained directly from their sources using means such as a direct link to the audio output source. For example, a mobile phone configured for controlling delivery of navigational notifications may be connected to a car stereo by a wireless or a hardwired link. The mobile phone may obtain the actual audio content or relevant information about the audio content (for example, identity and length of the song track, playback volume etc.) directly from the car stereo. In some embodiments, the mobile device configured for controlling delivery of notifications may itself be the source of non-navigational audio content.

Some components of the ambient sound such as music from a CD/MP3 player or a radio station playing known song tracks may be predicted in advance instead of being sensed or obtained by other means in real time. Ambient sound related to any audio content (for example, podcasts) stored on the mobile device configured for delivery of notifications is predictable. However, a car stereo tuned to a radio station broadcasting news may not be predictable.

In embodiments, audio parameters may be indicative of an ambient sound level. The ambient sound may be the overall ambient sound or optionally, the engine noise and other "background" sounds may be removed. In embodiments, audio parameters may be indicative of a level of a particular component of ambient sound such as conversation or music. In embodiments, audio parameters may be indicative of a predicted ambient sound level; for example, a prediction of ambient sound level related to song tracks playing on a CD/MP3 player. In embodiments, audio parameters may also be indicative of the level of a controllable ambient sound generated by controllable sources of sound such as entertainment audio sources such as MP3 players, CD players, etc. and communication devices such as mobile phones and the like.

In embodiments, audio parameters may be obtained in real time. For example, an audio parameter may be based on an instantaneous ambient sound level or it may be based on a moving average of the ambient sound level. The time window for determining the moving average may be fixed or variable depending on various factors including but not limited to the variability of ambient sound within the time window, other statistical or environmental factors or the like. Accordingly, in embodiments, the ambient sound may be sensed continuously.

In embodiments, audio parameters may be obtained periodically. The frequency for obtaining the audio parameters may be set according to a user preference, or it may be determined automatically based on factors including but not limited to the number of notifications waiting to be delivered, nature of notifications to be delivered, the length of time during which the notification delivery has been pending and characteristics of the sensed sound. For example, if there are a plurality of notifications to be delivered or if the notifications to be delivered have high priority, audio parameters may be updated with a high frequency. On the other hand, the frequency of updates may be lower if the detected ambient sound is substantially constant.

In embodiments, the determination of an audio parameter may be triggered as a result of a specific event. For example, the generation of a notification, or a substantially sudden or substantially significant change in the sensed ambient sound, may trigger the determination of an audio parameter. In embodiments, once determination of an audio parameter has been initiated by an event, the determination may continue in real-time or periodically.

Accordingly, the ambient sound may be sensed in real-time, periodically or be triggered by events such as the generation of a notification. A worker skilled in the art will readily understand that the frequency for sensing ambient sound will be equal to or greater than the frequency of updating of the associated audio parameter.

There may be an audio threshold associated with each audio parameter. As detailed in a later section, comparison of the audio parameter with respect to the associated audio threshold may determine at least partly the delivery of the notification.

Additional Parameters

Parameters other than the ones mentioned above may optionally be considered for controlling delivery of a notification. For example, a mobile device may be linked to sensors such as an accelerometer, a light sensor and the like. Delivery of a notification may be controlled based on an acceleration parameter or a light parameter indicative of information obtained from these sensors. For example, an audio notification may not be delivered when a mobile device is experiencing a substantially significant and sudden change in speed. The delivery of a notification may also be controlled based on other parameters related to user preferences, power consumption etc.

Controlling Delivery of Notification

Controlling delivery of a notification may comprise controlling a time for delivery of a notification or may comprise controlling the ambient sound prior to delivery of a notification. Controlling delivery of a notification may comprise controlling the volume for an audio delivery, the order of delivery when there are multiple notifications to be delivered and the number of repetitions for a notification delivered multiple times. Controlling delivery of a notification may comprise selecting one or more output modules for delivery of navigational notifications. Controlling delivery of a notification may also comprise controlling the modes of delivery of a navigational notification.

In embodiments, the delivery of the notification may be controlled with respect to a time of delivery. For example, a notification may be delivered immediately or the delivery may be delayed. In embodiments, an appropriate time for delivery may be determined based on aspects of the notification such as time-sensitivity and priority. For example, a notification that has a high time-sensitivity or priority, may be delivered immediately while the delivery of a notification that has a low time-sensitivity or priority may be deferred.

In embodiments, the appropriate time for delivery of a notification may be based on the ambient sound. For example, if the ambient sound level is low, the audio notification may be delivered immediately. However, if the user is engaged in a conversation or listening to music, delivery of the notification may be deferred until a pause in the conversation or a break in the music. If the user is listening to a known song track or other predictable audio content, the appropriate time for delivery may be when the ambient sound is predicted to be low, for example, when the song is predicted to be completed.

In embodiments, the ambient sound may be controlled during or prior to the delivery of a notification. For example, if a notification is to be delivered audibly, the car stereo may be turned off so that the audio notification delivered by a hand-held GPS navigation unit is heard clearly. In embodiments, the car stereo may be turned off only for delivery of time-sensitive or high priority notifications.

Controlling ambient sound may comprise controlling sources of non-navigational audio content. Controllable audio sources include, but are not limited to, mobile devices, audio/video entertainment systems such as CD/DVD players and wireless communication devices such as cellular telephones. A mobile device may be operatively linked to audio sources by means of a wireless link such as Bluetooth™, or by means of a wired link such as a TEL MUTE™ line for connection to a car stereo. Accordingly, control signals may be sent wirelessly or by a hard-wired link for achieving control of external devices.

In embodiments, the audio output source for navigational notifications and non-navigational audio content may be different. In this case, the volume for playback of non-navigational content may be reduced or muted prior to delivering the audio notification. For example, when a notification is delivered by a handheld GPS unit, the car stereo volume may be reduced or muted. Alternatively, the non-navigational audio content (for example, a song) may be paused prior to the delivery of a notification.

In embodiments, the audio output source for navigational notifications and non-navigational audio content may be the same. In this case, the navigational notification may be blended with the non-navigational content. For example, the notification may be delivered by the car stereo by blending the notification with the music with appropriate relative adjustment of volumes for the music and the notification. Alternatively, the non-navigational audio content may be paused prior to the delivery of a notification.

In some embodiments, the volume for audio delivery of a navigational notification may be increased to make it distinguishable from the ambient sound. For example, if the audio parameter is indicative of a high level of ambient sound and if at least part of the ambient sound is from sources that are not controllable (such as traffic or engine sounds), the volume of the audio output source for delivering notifications may be increased.

In embodiments, an audio notification may be delivered multiple times. The number of repetitions may be based at least in part on one or more aspects of the notification such as the time-sensitivity, priority or the like. The number of repetitions may also be based on the ambient sound. For example, a high priority notification may be repeated several times when the ambient sound level is high. In embodiments, a notification may be repeated until an acknowledgement is received from the user. For example, a high priority notification may be repeated until the user indicates with a voice command or by pressing the appropriate control on a touch screen that the notification has been received.

In some embodiments, the order of delivery of notifications may be controlled when there are multiple notifications waiting to be delivered. The notifications may be delivered in order of generation, in order of time-sensitivity, in order of priority or the like.

Controlling delivery of navigational notifications may comprise selecting one or more output modules or external devices for delivering the navigational notification. The selection may be performed on the basis of a user preference or based upon the context. For example, if the user is listening to music on the car stereo system, the notification may be delivered by the car stereo. However, if the car stereo is off, the notification may be delivered by the mobile device itself. As another example, the selection of an output module may be based on the time-sensitivity or priority of the notification. In embodiments, the notification may be delivered by multiple output modules or external devices. As an example, time-sensitive notifications may be delivered by multiple output modules while time-insensitive notifications may be delivered by a single output module.

In embodiments, a notification may be delivered in alternate or additional modes. For example, a notification may be delivered visually instead of or in addition to the audio delivery. A visual notification may be presented on a screen, display or the like. The visual notification may be presented symbolically (for example, with a left turn icon), graphically (for example, with arrows on a map), textually (for example, as a text message) or as a combination or variation thereof.

In embodiments, the mode of delivery is at least partly tactile. For example, the audio or visual notification delivery may be accompanied or preceded by a vibration alert signal. The vibration alert signal may alert the user to an upcoming notification and may also serve as a prompt to the user to take an appropriate action for more effective delivery of notification. For example, the user may be prompted to turn down the volume of the car stereo or to pause a telephone conversation for an audio notification. Similarly, for a visual notification, the user may turn their attention to a screen where the notification may be displayed.

Figure 3:
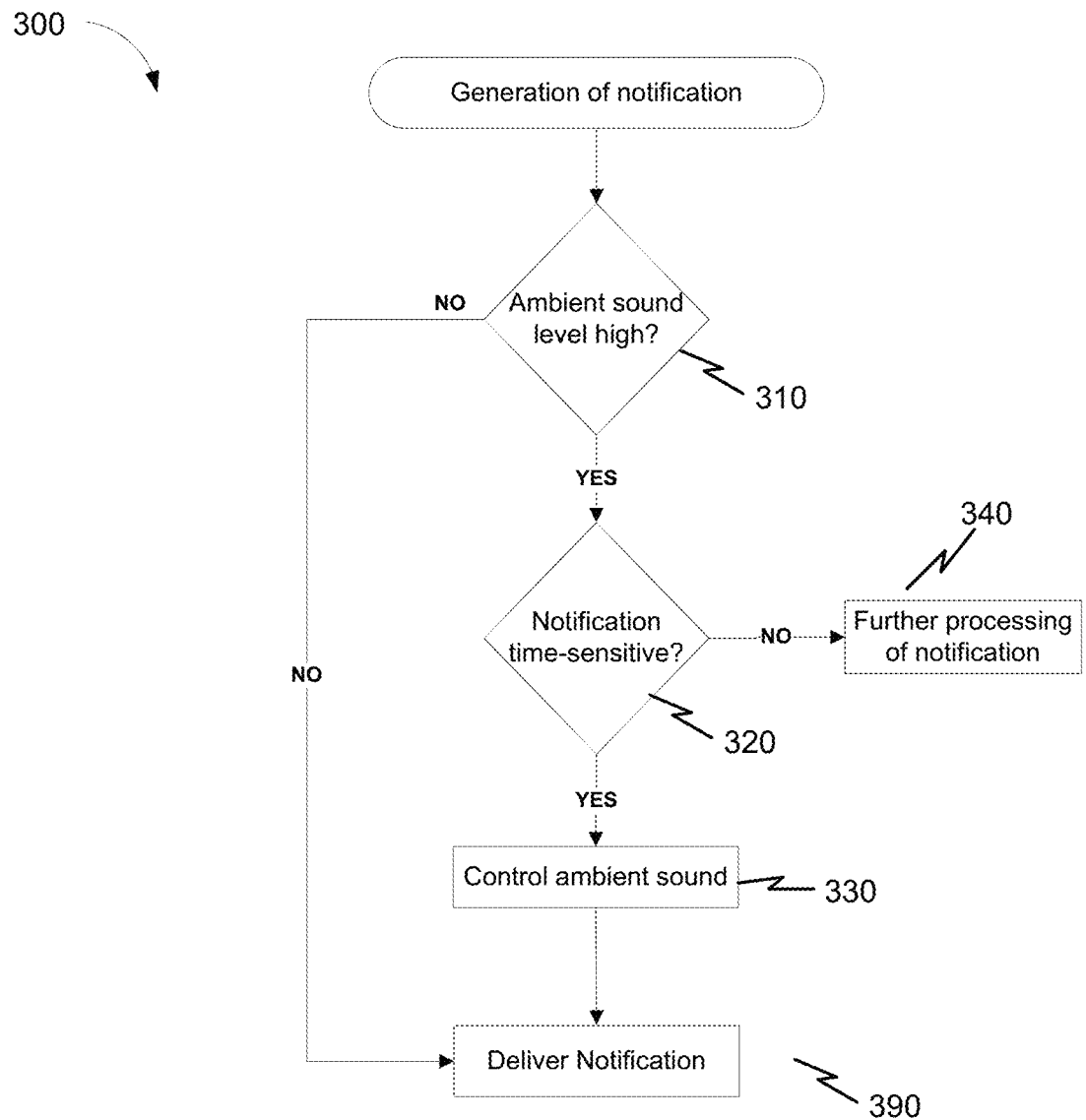
FIG. 3 is an exemplary flowchart presenting steps of a method for controlling delivery of navigational notifications in accordance with an embodiment of the present technology.

The present technology may be implemented as a method with steps as shown in FIG. 3. FIG. 3 is a flowchart of an exemplary method 300 for controlling delivery of a navigational notification according to an embodiment of the present technology.

Upon generation of a notification, an ambient sound level is obtained in step 310. If the ambient sound level is determined to be low, the notification is delivered in step 390. Delivery of the notification comprises being played audibly by at least one audio output module such as a speaker on a mobile phone or an external device such as a car stereo. Delivery may optionally comprise visual display on a screen.

If the ambient sound level is determined to be high in step 310, the time-sensitivity is obtained in step 320. If the notification is determined to be time-sensitive in step 320, the ambient sound is controlled in step 330 and then the method proceeds to step 390 where the notification is delivered as described above.

If the notification is not time-sensitive in step 320, the delivery of the notification is deferred for further processing in step 340. Optionally, an indication of the notification delivery status may be sent to the notification generation module generating the navigational notification.

Although, the step 320 of determining whether a notification is time-sensitive is shown as occurring after the step 310 of determining whether the ambient sound level is high, these steps may occur in either order or simultaneously. In embodiments, one of these steps may remain in progress while the other has been completed.

In embodiments, the ambient sound level may not necessarily be determined for every notification generated. For example, in a particular implementation of the method illustrated in FIG. 3 and discussed above, the ambient sound level may be determined periodically and when a notification is generated, delivery of the notification may be controlled based on the result from the last determination of ambient sound in conjunction with a determination of the time-sensitivity of the notification.

TABLE 1 shows different scenarios in which the above method is implemented for controlling delivery of notifications.

TABLE 1

| | Obtaining | | Controlling | |
| --- | --- | --- | --- | --- |
| | A<br>Ambient sound<br>level | B<br>Time-<br>sensitive? | 1<br>Ambient<br>Sound | 2<br>Time of<br>Delivery |
| Scenario 1 | Low | Yes | No | Immediate |
| Scenario 2 | High | Yes | Yes | Immediate |
| Scenario 3 | Low | No | No | Immediate |
| Scenario 4 | High | No | | Deferred |

With reference to Table 1, when ambient sound level is low, a time-sensitive notification will be delivered immediately as audio (Scenario 1). When ambient sound level is high, a time-sensitive notification will be delivered immediately and the ambient sound will be controlled prior to the delivery of audio notification (Scenario 2). When ambient sound level is low, a time-insensitive notification will be delivered immediately as audio (Scenario 3). When ambient sound level is high, delivery of a time-insensitive notification will be deferred for further processing (Scenario 4).

Although TABLE 1 (and FIG. 3) shows only ambient sound level and time-sensitivity parameters in columns A and B for controlling the delivery of a navigational notification, a worker skilled in the art will understand that columns A and B may be directed to different parameters. For example, column A may be directed to the absence or presence of a conversation instead of the total ambient sound level. There may also be other optional, alternate or additional parameters C, D, E etc. which may at least in part be used for determining notification delivery. For example, the priority of a notification may also be taken into account. As another example, the speed of movement of a mobile device may optionally be considered. Accordingly, a notification may not be delivered when a mobile device is traveling above a certain speed or during rapid changes in speed of the mobile device. A worker skilled in the art will also understand that the steps related to columns A, B, C, etc. may occur in any order and even simultaneously.

Similarly, in embodiments, aspects other than a time of delivery and ambient sound shown in columns 1 and 2 may optionally, alternately, or additionally be used for controlling the delivery of a notification.

Thresholds

In embodiments, thresholds or threshold criteria related to audio and notification parameters may be defined for the implementation of steps such as 310 and 320 of the method of FIG. 3. For example, in step 310, the ambient sound level may be determined to be high based on a comparison of an audio parameter indicative of an ambient sound level with the associated audio threshold. If the audio parameter is greater than the audio threshold, then the ambient sound level may be determined to be high.

In embodiments, the audio threshold may be defined to be indicative of an ambient sound level above which an audio notification may not be audible. In embodiments, different audio thresholds may be defined for different audio parameters. For example, the threshold associated with the sound level for music on the car stereo may be different from the threshold for the total ambient sound level.

The audio threshold may be based on the source or sources of ambient sound. For example, the audio threshold may be determined partly based on whether or not a major portion of the ambient sound is originating from a controllable or non-controllable source, or an external or internal source with respect to the vehicle.

In embodiments, different audio thresholds may be defined for different navigational notifications. For example, high priority notifications may have a different audio threshold than low priority notifications.

As noted previously, notification parameters may also have associated notification threshold criteria. For example, a time-sensitivity threshold may be defined for a notification such that the notification is delivered when the time-sensitivity parameter of the notification becomes greater than the time-sensitivity threshold. Notification threshold criteria may be determined by the notification generation module, the notification parameter module or the delivery control module.

The audio thresholds or the notification threshold criteria may be user-specified, predetermined or determined automatically. For example, the audio threshold may be determined by the notification generation module, the sensor module or any other device with processing capability that is able to obtain ambient sound data or ambient sound related data. The audio threshold may be based on a moving average of ambient sound where the averaging time window may be fixed or variable depending on a number of factors such as variability of ambient sound within the averaging time window, variation of the determined audio threshold from previously determined values and other such statistical and/or environmental factors.

The audio thresholds or the notification threshold criteria may be determined once, for example, upon initialization or when triggered by an event, or it may be determined substantially periodically or substantially continuously in real-time.

Deferred Audio Delivery of Notifications

As mentioned above, in some embodiments, audio delivery of a notification may be deferred. In the exemplary embodiment of FIG. 3, audio delivery of a notification is deferred when the notification is not time-sensitive and the ambient sound level is high.

In embodiments, the audio delivery may be deferred until a later appropriate time. During the time that audio delivery is deferred, a notification may be subjected to further processing. Further processing may comprise updating the notification. For example, a notification such as "heavy traffic in 50 kms" may need to be updated as the user approaches the heavy traffic region. Notification parameters associated with a notification may also be re-evaluated and updated during the time notification delivery is deferred. This updating may occur continuously or periodically.

In embodiments, delivery of a notification may be deferred until one or more conditions are satisfied. In embodiments, the delivery may be deferred until one of several conditions is satisfied. At least some of the conditions may be related to the audio and notification parameters.

In embodiments, the delivery may be deferred until a condition related to the ambient sound is satisfied. For example, delivery may be deferred until the detected ambient sound level becomes low or there is a pause in the conversation or the end of a song track is reached. Accordingly, the audio parameters are updated during the time that the audio delivery of the notification is deferred. The updated audio parameters are monitored to control the delivery of the notification. The updating or monitoring or both may occur continuously or periodically.

In embodiments, the delivery of a notification may be delayed until a condition related to a notification parameter is satisfied. For example, the audio delivery may occur when the time-sensitivity parameter indicates a certain level of time-sensitivity. Accordingly, the time sensitivity parameter may be updated during the time that the audio delivery of the notification is deferred. The updated audio parameters are monitored to control the delivery of the notification. The updating or monitoring or both may occur continuously or periodically.

In embodiments, the one or more conditions to be satisfied for delivery of a notification may be different for different notifications. For example, the ambient sound level for allowing delivery of a notification may be different for traffic updates than for passive reassurance notifications. In a particular implementation, this may be achieved by having a different audio threshold for different notifications. Accordingly, in addition to notification parameters, each notification may also have an associated set of rules related to the one or more conditions which have to be satisfied for that notification to be delivered.

A notification may be stored (exemplarily in a memory module) while delivery is deferred. Multiple notifications may be stored at any given instant, each with associated notification parameters, and optionally rules. The stored notifications may be monitored to determine an appropriate instant for their delivery. In embodiments, the stored notifications may be monitored in order of their entry into storage. In embodiments, notifications may be monitored in an order based on a notification parameter such as the time-sensitivity or priority parameter. The monitoring may occur continuously or periodically.

In some embodiments, the delivery of a notification may be deferred up to a maximum length of time after its generation as defined by an expiry time. The expiry time may be the same for all notifications or may be different. In some embodiments, the expiry time may depend on the type of the notification. The expiry time may be based on a number of factors such as time-sensitivity or a priority level of the notification, time lapsed since the last notification was delivered, estimated time to the generation of the next notification, or the like.

When expiry time is reached, the notification may be delivered in audio mode or it may be discarded. In some embodiments, the notification may be delivered in other modes. In embodiments, when a notification is discarded, an indication may be sent to the notification generation module for the generation of a new notification.

A worker skilled in the art will understand that in some situations a notification may be discarded before the expiry time. For example, a notification such as "keep straight" may be discarded if it becomes obsolete due to a change in course.

Computer Program Product

Acts associated with the method described herein can be implemented as coded instructions in a computer program product. In other words, the computer program product is a computer-readable medium upon which software code is recorded to execute the method when the computer program product is loaded into memory and executed on the microprocessor of the mobile device.

Acts associated with the method described herein can be implemented as coded instructions in plural computer program products. For example, a first portion of the method may be performed using one mobile device, and a second portion of the method may be performed using a different operatively associated or communicatively linked mobile device, server, or the like. In this case, each computer program product is a computer-readable medium upon which software code is recorded to execute appropriate portions of the method when a computer program product is loaded into memory and executed on the microprocessor of a wireless communication device.

Mobile Device

In embodiments, the method described herein may be implemented on a mobile device. The mobile device of this disclosure may be a cellular telephone, satellite telephone, smartphone, PDA, laptop, net book, a portable navigation system such as a handheld or vehicular GPS unit, or any other device that can be configured to allow a determination of its location. Additional types of mobile devices would be readily known to a worker skilled in the art.

In embodiments, the mobile device comprises a location identification module and a delivery control module. The location identification module is configured to allow a determination of its location. The delivery control module may be configured to obtain notification and audio parameters and to control delivery of the navigational notifications at least in part based on the notification and audio parameters.

Figure 4:
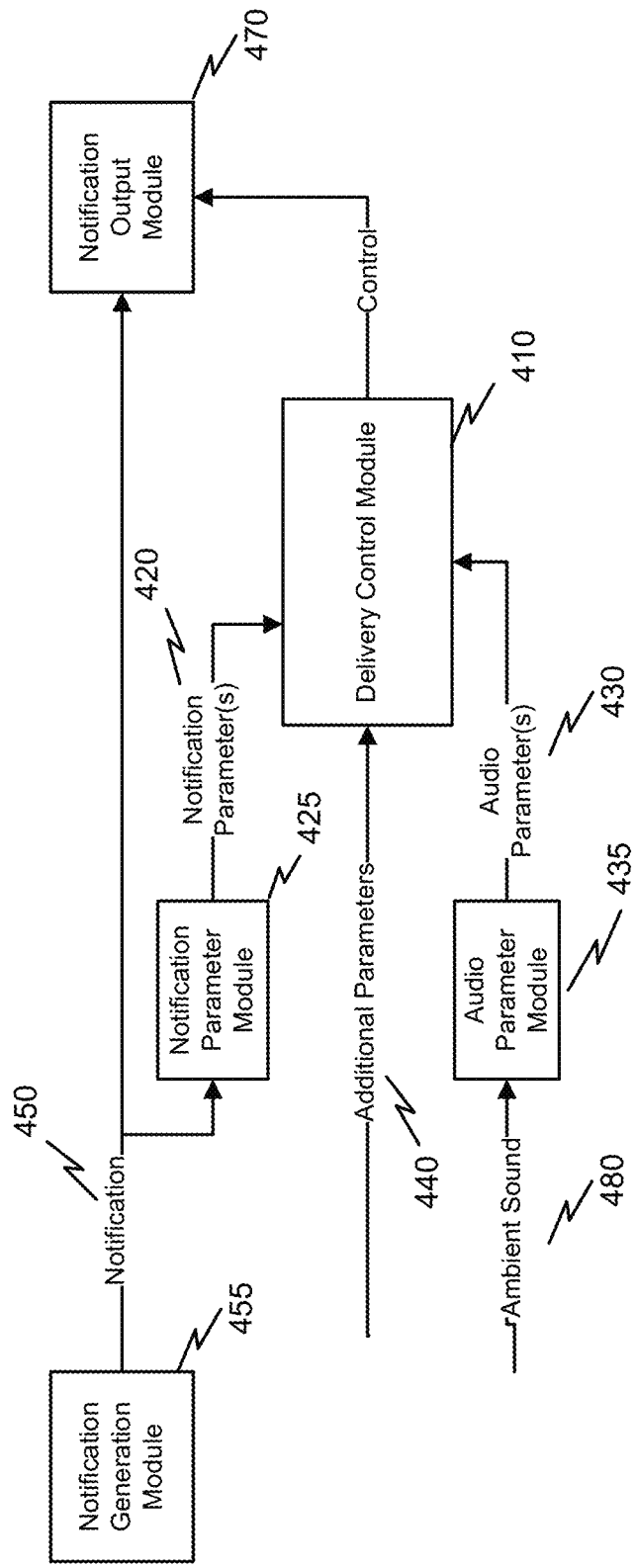
FIG. 4 is a schematic of an exemplary configuration utilizing a delivery control module of the present technology for controlling delivery of navigational notifications.

FIG. 4 is a schematic of an exemplary configuration utilizing a delivery control module of the present technology. The delivery control module 410 obtains one or more notification parameters 420 and one or more audio parameters 430 respectively from a communicatively linked notification parameter module 425 and a communicatively linked audio parameter module 435. Optionally, additional parameters 440 may also be obtained by the delivery control module 410. The delivery control module then controls delivery of the notification, at least in part, based on the obtained notification and audio parameters. The notification 450 may be generated by an operatively associated notification generation module 455 and delivered by one or more operatively associated notification output modules 470.

A processing module may be operatively coupled with the location identification module and the delivery control module. The processing module may be configured to coordinate the functions of the location identification and delivery control modules and to process different types of data using one or more processors. In embodiments, the processing module may be integrated with the delivery control module. In embodiments, the processing module is the delivery control module. In embodiments, the processing module comprises or is operatively associated with a memory module configured for storage of different types of data. Appropriate processing and memory modules would be readily known to a worker skilled in the art.

In embodiments, GPS receivers are used to determine the location of the mobile device. Although the present disclosure refers expressly to the "Global Positioning System", it should be understood that this term and its abbreviation "GPS" are being used expansively to include any satellite-based navigation-signal broadcast system, and would therefore include other systems used around the world including the Beidou (COMPASS) system being developed by China, the multi-national Galileo system being developed by the European Union, in collaboration with China, India, Morocco, Saudi Arabia and South Korea, Russia's GLONASS system, India's proposed Navigational Satellite System (IRNSS), and Japan's proposed QZSS regional system.

In embodiments, the mobile device comprises a notification generation module configured to obtain location data from the location identification module and generate navigational notifications at least in part based on the obtained location data. In embodiments, one or more map databases with map information may be stored locally in the notification generation module. In embodiments, one or more map databases may be communicatively linked to the notification generation module. In embodiments, the map databases may be located remotely at one or more map servers accessed via a network. The notification generation module may be integrated or operatively coupled with one or both of the location identification module and the delivery control module.

In embodiments, one or more remote servers may monitor the current location of a user, for the purpose of obtaining real-time information, such as traffic updates and other location based services. Accordingly, the mobile device may be configured to regularly update its location information with the server. In embodiments, the server may also serve to generate navigation instructions based, at least partly, on the current location of a user. Accordingly, the mobile device may be configured to provide other route related requests to the server.

In embodiments, the mobile device may comprise one or more notification parameter modules configured to determine notification parameters for navigational notifications generated at least in part based on location data from the location identification module. In embodiments, a notification parameter module may be integrated or operatively coupled with the delivery control module. In embodiments, a notification parameter module may be integrated or operatively coupled with the notification generation module.

The processing required for the determination of the notification parameters may be performed by the mobile device, by a server managed exemplarily by a service and application provider, or by a combination of both. Information required for the processing may at least partly be stored on the mobile device, on the server of the service and application provider, or on a server of a data and content provider communicatively linked with the appropriate processing entities, such as described above. In embodiments, the distribution of the processing burden may be based on the amount of data available for processing and the available communication bandwidth for data transfer between the various processing entities.

In embodiments, the mobile device may comprise a sensing module comprising a sensor for sensing ambient sound such as a microphone. Additional sensors, including but not limited to light sensors and accelerometers may also be provided. In embodiments, the sensor module may be further configured to process signals detected by the sensors.

In embodiments, the mobile device may comprise one or more audio parameter modules configured to determine audio parameters indicative of ambient sound. In embodiments, the audio parameter module may be integrated or operatively coupled with one or both of the delivery control module and the sensor module.

In some embodiments, the mobile device may integrate one or more output modules such as, but not limited to, speakers and displays. The output modules may be communicatively coupled to the delivery control module, the notification generation module or both.

In some embodiments, the mobile device may, in addition, be communicatively coupled to one or more external devices. For example, the mobile device may be coupled to car stereo speakers. The external devices may be configured to deliver navigational notifications based on one or more control signals received from the delivery control module. The mobile device may be communicatively coupled to the external devices by means of a wireless or a hard-wired connection. Wireless communication can be achieved using any short-range or long-range communication protocols that may be readily known to a worker skilled in the art. For example, the mobile device may be linked to some external devices using Bluetooth™ and to others using radio frequency transmission. Accordingly, the mobile device may comprise additional short-range and long-range communication modules. Examples of short-range communications modules include a Bluetooth™ module, an infrared module with associated circuits and components, and a TEL MUTE line for communication with similarly linked devices.

Figure 5:
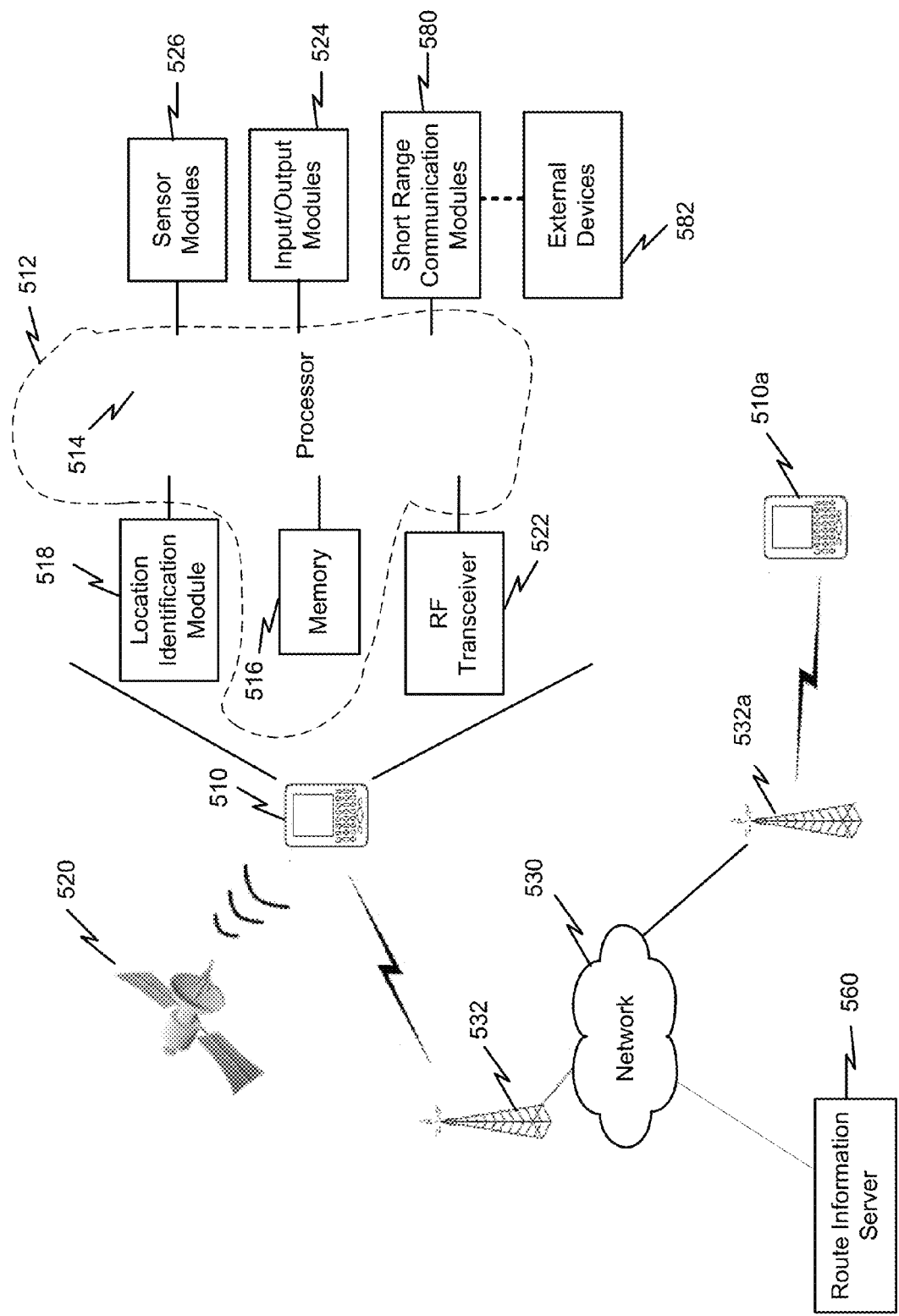
FIG. 5 is a schematic depiction of an exemplary mobile device configured for controlling delivery of navigational notifications.

FIG. 5 shows a block diagram depicting certain main components of an exemplary mobile device 510 with wireless communications capability. It should be understood that this figure is intentionally simplified to show only certain components; the device 510 may include other components beyond those shown in FIG. 5.

The mobile device 510 is operatively associated with a GPS system 520 allowing for determining its location. The mobile device 510 is linked to a cellular network 530 through a base-station 532, and thereby to one or more servers 540 of a service and application provider, and to one or more servers 550 of a data and content provider. Additional mobile devices 510a may be linked to the cellular network 530 using the same base station 532 or a separate base station 532a. The cellular network 530 thus serves for data transfer between peer mobile devices 510, 510a.

The mobile device 510 further comprises a location identification module 518, which is configured to determine the location of the mobile device. In this embodiment, the location identification module 518 includes a GPS receiver chipset for receiving GPS radio signals transmitted from the one or more orbiting GPS satellites 520. The GPS receiver chipset can be embedded within the device or externally connected, such as, for example, a Bluetooth™ GPS puck or dongle. Other systems for determining location may be used in place of GPS, as would be readily understood by a worker skilled in the art. Navigational notifications are generated at least in part based on location data from the location identification module 518.

The device 510 comprises a processing module 512, which includes a microprocessor 514 (or simply a "processor") and operatively associated memory 516 (in the form of RAM or flash memory or both), to enable a variety of device functions and to execute an operating system for running software applications loaded on the device. The processing module 512 is configured to determine notification parameters for the navigational notifications generated, to determine audio parameters indicative of the ambient sound and to control the delivery of the navigational notifications exemplarily by one or more output modules 524. The delivery of the navigational notifications is at least in part based on the notification and audio parameters. Accordingly, the processing module 512 functions at least in part as the delivery control module.

The device 510 includes a radiofrequency (RF) transceiver 522 for communicating wirelessly with the base station 532 of a wireless network 530. The base station 532 may be a cellular base station, wireless access point, or the like. The base station 532 may vary as the wireless device travels, for example, using well-known handoff processes in cellular networks. The RF transceiver 522 may optionally be alternatively or additionally used for communicating directly with a peer device such as a third party wireless communication device, for example as may occur in some ad-hoc networks. The RF transceiver enables access to a wireless communication channel for transmitting and receiving data. The RF transceiver 522 may further allow for a wireless voice channel for transmitting and receiving voice communications, for example concurrently with transmission and reception of data over the same or a separate logical or physical channel.

The wireless communication device 510 sends and receives communication signals via the RF transceiver 522. When communicating wirelessly with a base station 532 of a wireless network 530, the device 510 may communicate in accordance with one or more appropriate technologies such as: Global Systems for Mobile communications (GSM), General Packet Radio Service (GPRS), Code Division Multiple Access (CDMA) technologies, Wideband CDMA (WCDMA), whether 2G, 3G, High speed packet access (HSPA), Universal Mobile Telecommunication System (UMTS) based technologies, Long Term Evolution (LTE) technologies, Orthogonal Frequency Division Multiplexing (OFDM) technologies, Ultra-Wideband (UWB) technologies, WiFi™ or WiMAX™ technologies, or other communication technologies and protocols as would readily be understood by a worker skilled in the art. In some embodiments, the wireless device 510 may be capable of operation using multiple protocols. The base station 532 may be part of a wireless network, such as a cellular network, local-area network, wide-area network, wireless hotspot network, or the like. The wireless device, base station, network components, and the like, may be configured for data communication, voice communication, or a combination thereof, possibly using additional components, configurations and procedures where appropriate, such as SIM cards, authorization and authentication procedures, handoff procedures, and the like, as would be readily understood by a worker skilled in the art.

Referring to FIG. 5, the wireless communication device is linked to route information servers 560 which may include public or private route information servers. The route information servers are typically map servers that provide map data to networked computing devices or wireless devices upon request, for example, in vector format or alternatively as bitmaps. In addition to providing the map data, the route information servers (e.g. the map servers) can also provide route instructions or route directions which are turn-by-turn instructions for each decision point along the route. These route information servers are communicatively connected to the for transmitting route information to each wireless communications device 510 in response to location data received from each wireless communications device. The "location data" comprises (1) the current location of the respective wireless communications device, e.g. its GPS position fix, which is used to represent the starting location, and (2) the destination location, which has been received wirelessly from the sender. The location data may also include a default location that has been specified, set or preconfigured by the sender or by the recipient for use in generating the route information in the event that the current location cannot be determined.

The mobile device comprises one or more input/output modules or user interfaces (UI's) 524. The device 510 may include one or more of the following: a display (e.g. a small LCD screen), a thumbwheel and/or trackball, a keyboard, a touch screen, a keypad, a button, a speaker, a still camera and a video camera. The mobile device comprises one or more sensor modules 526 including but not limited to a microphone, an orientation sensor, an accelerometer, a light sensor etc.

The mobile device comprises short-range communication modules 580 for communication between the mobile device and other similarly enabled external devices 582. For example, short-range communication modules 580 may include a Bluetooth communication module for communicating with a car stereo. These devices 582 may also be used exemplarily to deliver the navigational notifications.

Exemplary Embodiments of Different Scenarios

Implementations of the present technology will now be further explained with regard to example scenarios. It should be expressly understood that these scenarios are only examples that are provided solely for the purpose of illustrating how the technology works in certain circumstances. Accordingly, these examples should not be construed as limiting any of the aspects of the technology already described above and claimed in the appended claims.

EXAMPLE 1

Figure 6:
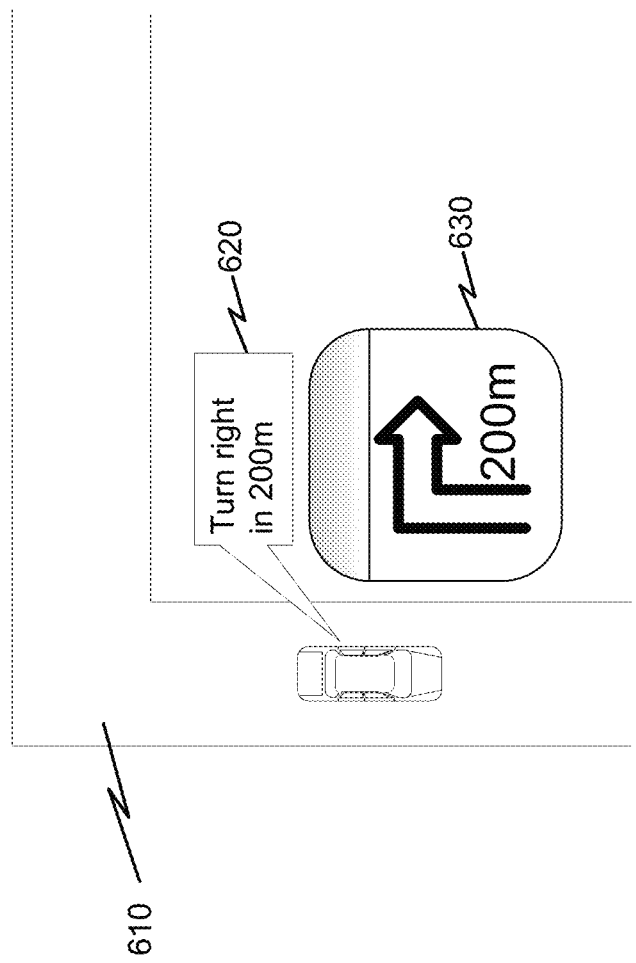
FIG. 6 is an illustration of an exemplary scenario in which a navigational notification is generated and its delivery is controlled.

A first exemplary scenario with a notification "turn in 200 m" is considered below. Referring to FIG. 6, the notification is generated when the car is 200 m away from a right turn 610. The delivery control module obtains the notification from the notification generation module and notification parameters from the notification parameter module. The time-sensitivity for this notification is extremely high, and the time-sensitivity parameter may be represented, for example with a numeral 0 indicating the highest level of time-sensitivity.

The delivery control module then requests an audio parameter from the audio parameter module. The audio parameter module triggers a sensing of the ambient sound, and processes the sensed ambient sound in order to determine the audio parameter. The audio parameter module determines an audio parameter indicative of the level of the total detected ambient sound. The delivery control module performs a comparison of the obtained audio parameter with the audio threshold. The ambient sound is determined to be high as the audio parameter is greater than threshold.

In this exemplary scenario, the car stereo is used to deliver navigational notifications. The delivery control module is configured to obtain information indicating that the car stereo is on (for example, via the Bluetooth link with the car stereo). The delivery control module thus sends control signals to the car stereo to pause the playback of music.

The delivery control module also transmits the audio data of the notification to the car stereo with information regarding the minimum volume for playback, which may be determined based on the audio parameter. The car stereo provides audio playback of the navigational notification 620 at the appropriate volume as indicated by the delivery control module. The delivery control module also transmits the notification text to the car stereo screen for a visual output in addition to the audio output. In addition, the display screen of the mobile device displays the notification by means of a flashing red arrow and an attached "200 m" text label 630. The text label may be updated in real time to indicate the distance remaining to the approaching turn.

EXAMPLE 2

Figure 7:
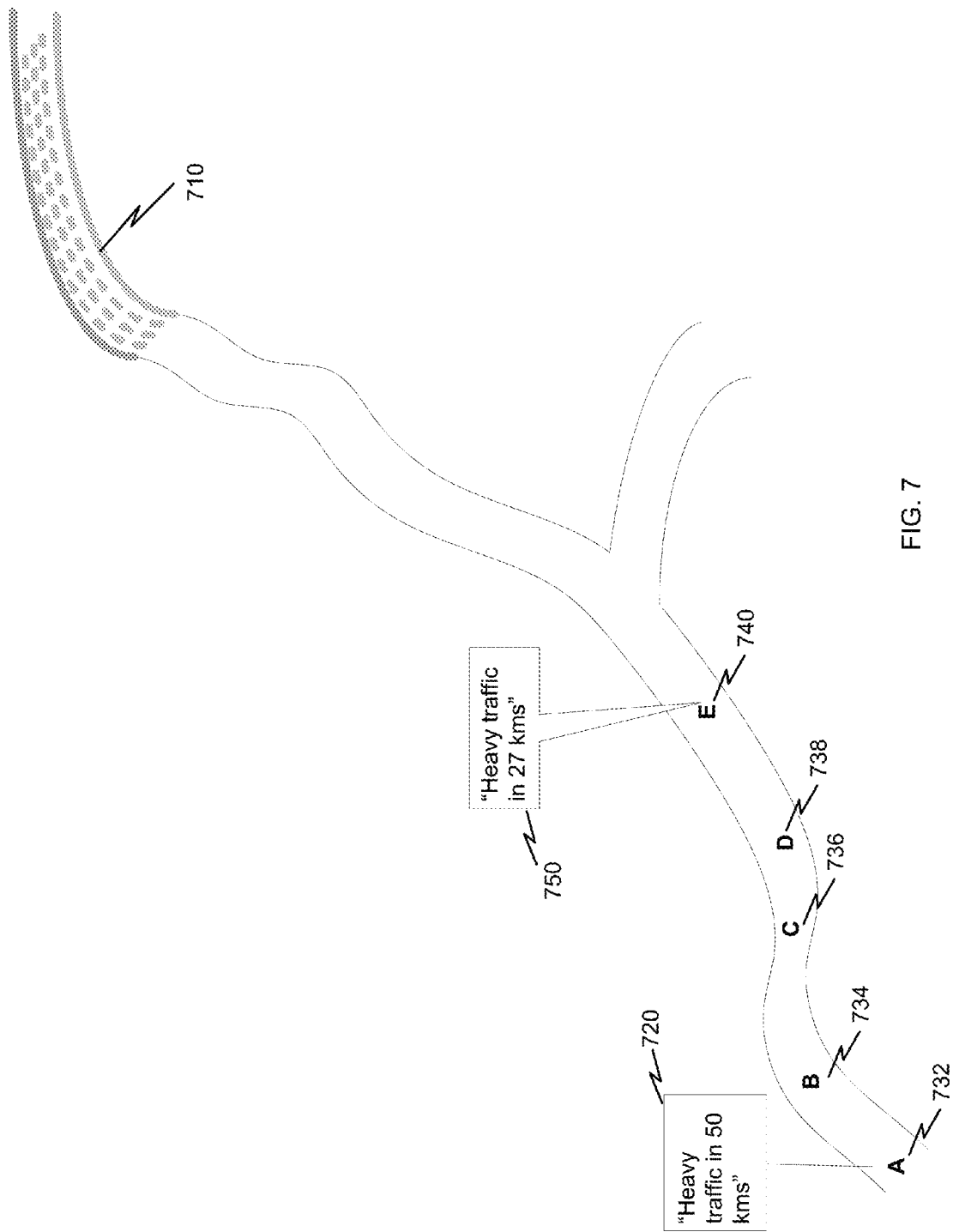
FIG. 7 is an illustration of another exemplary scenario in which a navigational notification is generated and its delivery is controlled.

Another exemplary scenario, with a notification "heavy traffic in 50 km", is considered next. Referring to FIG. 7, a notification which identifies heavy traffic at 710 is generated 720 at point A 732. The time-sensitivity for this notification is low, and the time-sensitivity parameter may be represented, for example with a numeral "5" indicating a low level of time-sensitivity. The relevant audio parameters indicate a high ambient sound level, the car stereo is on and, in addition, the user is engaged in conversation.

The notification is placed in a memory module along with the notification parameters and an expiry time. The expiry time is reached when the user is at point B 734, with the ambient sound level having remained high throughout this time. As a result, the notification is discarded and a request is sent to the notification generation module to generate a new notification. A new updated notification "heavy traffic in 45 kms" with a higher time-sensitivity parameter of "4" is generated at B 734.

This process is repeated three additional times through points C 736, D 738 and E 740 by which point four expiry times have lapsed with subsequent regeneration of notifications of a higher time-sensitivity parameter. At point E 740, the notification "heavy traffic in 27 kms" is generated with a time-sensitivity parameter of "0", indicative of the highest level of time-sensitivity. The notification is finally delivered 750, audibly and visually, at point E 740 by the car stereo (following steps as in the scenario discussed above).

This new technology has been described in terms of specific implementations and configurations (and variants thereof) which are intended to be exemplary only. The scope of the exclusive right sought by the applicant is therefore intended to be limited solely by the appended claims.

The invention claimed is:

1. A method of delivering a navigational notification generated at a mobile device, said method comprising:

obtaining two or more notification parameters associated with said navigation notification, wherein a first one of said notification parameters is a time-sensitivity parameter indicative of whether or not said navigational notification is to be delivered within or before a certain time, wherein the time-sensitivity parameter is further indicative of an amount of time available for the notification to be delivered within or before the certain time, and a second one of said notification parameters is a priority parameter indicative of an importance of said navigational notification;

obtaining one or more audio parameters indicative of an ambient sound level; and controlling a time of delivery of said navigational notification based on said time-sensitivity parameter, said priority parameter, and said one or more audio parameters, wherein said navigational notification is delivered when the mobile device determines that an ambient sound level is below an audio threshold value and the time-sensitivity parameter is greater than a time-sensitivity threshold level, wherein delivery of said navigational notification is deferred when said mobile device determines that the time-sensitivity parameter is less than said time-sensitivity threshold level and the audio parameter is greater than an the audio threshold value, wherein said audio threshold value is dependent on said priority parameter.

2. The method of claim 1, wherein said controlling further comprises controlling one or more of: a mode of delivery of said navigational notification; and volume for said delivery of said navigation notification.

3. The method of claim 1, wherein said ambient sound level is a sensed ambient sound level or a predicted ambient sound level.

4. The method of claim 1, further comprising controlling, at least partially, said ambient sound level prior to or during delivery of said navigational notification.

5. The method of claim 1 wherein said navigational notification is delivered substantially immediately when said mobile device determines that the audio parameter is less than the audio threshold value.

6. The method of claim 1, wherein the navigational notification is delivered substantially immediately when said time-sensitivity parameter is greater than a time-sensitivity threshold.

7. The method of claim 6, wherein said ambient sound level is at least partially controlled prior to or during the delivery of said navigational notification when said mobile device determines that the audio parameter is greater than the audio threshold value.

8. The method of claim 1, further comprising storing said navigational notification and updating at least one of said one or more audio parameters while said navigation notification is stored.

9. The method of claim 8, wherein said navigational notification is delivered and discarded when said mobile device determines that said at least one updated audio parameter is less than the audio threshold value.

10. The method of claim 8, wherein said navigational notification is delivered and discarded when said at least one updated audio parameter is greater than the audio threshold value.

11. The method of claim 8, wherein said navigational notification is delivered and discarded or discarded when lapsed time since generation of said navigational notification is greater than an expiry time.

12. The method of claim 8, wherein said stored navigational notification is monitored for delivery in an order determined based on one or more of:

order of entry into storage; said priority parameter; and said time-sensitivity parameter.

13. The method of claim 1, wherein said obtaining is continuous, periodic or triggered.

14. The method of claim 1, wherein said obtaining comprises receiving said notification parameters or audio parameters from a communicatively linked server or processing module.

15. The method of claim 1, wherein said two or more notification parameters further comprise one or more of: a length of said navigational notification; and a preferred delivery mode of said navigational notification.

16. The method of claim 1, further comprising obtaining an indication of whether a current route being navigated is familiar or unfamiliar, and wherein said navigational notification is a reassurance notification which does not prompt a specific user action, and wherein said priority parameter is assigned a priority value based at least in part on said indication of whether the current route being navigated is familiar or unfamiliar.

17. The method of claim 1, wherein an update frequency for obtaining said audio parameters is determined automatically based on one or more of: a number of notifications waiting to be delivered; a nature of notifications to be delivered; a length of time during which notification delivery has been pending; and characteristics of the ambient sound level.

18. A mobile device comprising:

a delivery control module configured to obtain one or more audio parameters and two or more notification parameters, said two or more notification parameters associated with the navigational notification, wherein a first one of said notification parameters is a time-sensitivity parameter indicative of whether or not said navigational notification is to be delivered within or before a certain time, wherein the time-sensitivity parameter is further indicative of an amount of time available for the notification to be delivered within or before the certain time, and a second one of said notification parameters is a priority parameter indicative of an importance of said navigational notification, said delivery control module further configured to generate one or more control signals for controlling a time of delivery of the navigational notification, based on the one or more audio parameters, and the notification parameters, wherein said navigational notification is delivered when said delivery control module determines that the ambient sound level is below an audio threshold value and the time-sensitivity parameter is greater than a time-sensitivity threshold, wherein delivery of said navigational notification is deferred when said delivery control module determines that the time-sensitivity parameter is less than said time-sensitivity threshold and the audioparameter is greater than an the audio threshold value, wherein said audio threshold value is dependent on said priority parameter.

19. The mobile device of claim 18, further comprising:
a sensor module configured to sense ambient sound level;
one or more audio parameter modules configured to determine said audio parameters, wherein at least one of said audio parameters is indicative of said sensed ambient sound level;
one or more notification parameter modules configured to determine said two or more notification parameters; and
one or more output modules communicatively linked to the delivery control module, the output modules configured to receive the one or more control signals and deliver said navigational notification based at least in part on said one or more control signals.

20. The mobile device of claim 18, further comprising a memory module configured to store navigational notifications.

21. The mobile device of claim 18, wherein said mobile device is communicatively linked to one or more external devices via a wireless or a hardwired connection.

22. The mobile device of claim 18, wherein said delivery control module is further configured to select one of said one or more output modules for delivery of the navigational notification, based at least in part on said notification parameters.

23. A computer program product for delivering a navigational notification generated for a mobile device, said computer program product comprising code which, when loaded into a memory and executed on an operatively associated processor, is configured to perform the following:
obtaining two or more notification parameters associated with said navigational notification, wherein a first one of said notification parameters is a time-sensitivity parameter indicative of whether or not said navigational notification is to be delivered within or before a certain time, wherein the time-sensitivity parameter is further indicative of an amount of time available for the notification to be delivered within or before the certain time, and a second one of said notification parameters is a priority parameter indicative of an importance of said navigational notification;
obtaining one or more audio parameters indicative of an ambient sound level; and
controlling a time of delivery of said navigational notification, based on said time-sensitivity parameter, said priority parameter, and said one or more audio parameters, wherein said navigational notification is delivered when the ambient sound level is below an audio threshold value and the time-sensitivity parameter is greater than a time-sensitivity threshold level, wherein delivery of said navigational notification is deferred when said mobile device determines that the time-sensitivity parameter is less than said time-sensitivity threshold level and the audio parameter is greater than an the audio threshold value, wherein said audio threshold value is dependent on said priority parameter.

24. The computer program product of claim 23, wherein said controlling comprises controlling one or more of: a mode of delivery for said navigation notification; and a volume for said delivery of said navigation notification.

25. The computer program product of claim 23, further configured to perform:
controlling, at least partially, said ambient sound level.

* * * * *